(12) United States Patent
Taitel

(10) Patent No.: US 7,512,613 B2
(45) Date of Patent: Mar. 31, 2009

(54) NON-INTRUSIVE DATA LOGGING

(75) Inventor: Howard Taitel, Sudbury, MA (US)

(73) Assignee: The MathWorks, Inc., Natick, MA (US)

(*) Notice: Subject to any disclaimer, the term of this patent is extended or adjusted under 35 U.S.C. 154(b) by 297 days.

(21) Appl. No.: 10/417,397

(22) Filed: Apr. 16, 2003

(65) Prior Publication Data
US 2004/0210578 A1 Oct. 21, 2004

(51) Int. Cl.
G06F 17/30 (2006.01)

(52) U.S. Cl. .......................... 707/101; 707/3; 707/202; 703/1; 717/135; 345/952

(58) Field of Classification Search .................. 707/102, 707/201–202, 100, 2–5, 101; 356/4.02; 345/952; 717/135; 714/741; 703/1, 14
See application file for complete search history.

(56) References Cited

U.S. PATENT DOCUMENTS

| | | | |
|---|---|---|---|
| 6,728,879 B1 * | 4/2004 | Atkinson | 713/168 |
| 6,823,349 B1 * | 11/2004 | Taylor et al. | 707/204 |
| 7,337,430 B2 * | 2/2008 | Aberg | 717/109 |
| 2001/0054091 A1 * | 12/2001 | Lenz et al. | 709/221 |
| 2003/0195735 A1 * | 10/2003 | Rosedale et al. | 703/13 |
| 2004/0100502 A1 * | 5/2004 | Ren | 345/802 |
| 2004/0117460 A1 * | 6/2004 | Walsh et al. | 709/219 |
| 2005/0138083 A1 * | 6/2005 | Smith-Semedo et al. | 707/200 |

* cited by examiner

Primary Examiner—Cheryl Lewis
(74) Attorney, Agent, or Firm—Lahive & Cockfield, LLP; Kevin J. Canning

(57) ABSTRACT

The invention relates to enabling a user to log data of a block diagram without using a functional logging block within the block diagram. There is a first timing identifier for a first data set based on a timing characteristic of the first data set. There is also a first task identifier established by an execution engine that is associated with a first data set. The logging of the data associated with the first data set is based on the first timing identifier and the first task identifier.

51 Claims, 10 Drawing Sheets

NON-INTRUSIVE DATA LOGGING

TECHNICAL FIELD

This invention relates to block diagram execution, and more particularly to non-intrusively logging data.

BACKGROUND

Software programs exist that enable an engineer to model and simulate a system using functional element blocks representing different aspects of the simulation of a system. For example, functional element blocks can include a sine wave generator, an amplifier with a predefined gain, an integrator, and the like. To log data produced by one of these functional element blocks, software programs include a functional logging element block. The functional logging element block is a graphical block that the user inserts into the graphical representation of the simulation model. The functional logging element is compiled, along with the rest of the functional elements, when the graphical representation is compiled into executable code. The functional logging element block transmits the output from the preceding functional element block to the simulation workspace. The workspace is a memory area to which logged data is sent and/or stored. The user can view the data logged in the workspace after the simulation has executed to review how the signal changed over time.

SUMMARY

The invention relates to enabling a user to log data of a block diagram without using a functional logging element within the block diagram. In one aspect, there is a method including enabling a user to log data of a block diagram without using a functional logging block within the block diagram. In other examples, the method can further include querying an execution engine executing the block diagram to determine whether a functional element of the block diagram associated with the data is executing at a particular time point. The method can also include setting a value of a property of a data structure associated with a functional element of the block diagram to indicate logging of the data associated with the functional element. The data structure can include an object.

The method can also include generating code from the block diagram, the code being configured to execute external to an execution engine and including a portion to log the data associated with the functional element based on the value of the property. In one example, the data is a first data set. In this example, the method can also include determining if the first data set is equivalent a second data set and generating in a log for the second data set an association with the first data set if the first data set is determined equivalent to the second data set.

The method can also include generating a pointer to the first data set and storing the pointer with the second data set. The method can also include generating the block diagram using functional graphical elements and rendering a non-functional graphical affordance to indicate the data to be logged. The data can correspond to a signal at an input port, a signal at an output port, or an internal state of a functional element within the block diagram. The method can also include generating a destination object to log the data, associating a location in the destination object with the data, and associating a portion of execution data with the data. The method can also include associating the location with the portion of execution data.

The method can also include generating an event buffer associated with the data. The method can also include modifying an event element in the event buffer when an associated circular data buffer overwrites existing data. The method can also include executing the block diagram on a first computing device, storing a destination object on a second computing device and establishing a communication channel between the executing block diagram and the destination object to transmit the data. The data can be associated with a bus comprising heterogeneous signals.

In another aspect, there is a method including receiving a block diagram and generating a user interface to enable a user to select data associated with functional modeling elements to be logged during block diagram execution without the use of a additional functional logging element within the block diagram. In other examples, the method can also include executing the block diagram on a first computing device, rendering the user interface on a second computing device, and establishing a communication channel between the executing block diagram and the user interface to transmit the data. In one example, the data is a first data set. In this example, the method can also include enabling the user to define one or more groups, each group comprising one or more data sets selected from a plurality of available data sets associated with the block diagram. The method can also include receiving an input from the user indicating a first group selected from the defined one or more groups, and logging the respective one or more data sets associated with the first group.

In another aspect there is a system including a storage device and a selection module. The storage device includes a block diagram. The selection module is configured to enable a user to query a logging property of a functional modeling element of the block diagram to enable a user to log data associated with the modeling element during block diagram execution without using an additional functional logging element within the block diagram. In other examples, the data is a first data set. The system can also include a comparator module configured to determine when the first data set is equivalent to a second data set. The system can also include a comparator module configured to determine when the first data set has a time vector equivalent to a second data set.

The comparator module can be further configured to store the time vector and associate the time vector with the first data set and the second data set. The time vector can comprise a compact format. The compact format can include at least three of a start time, a stop time, an interval, and number of elements. The system can also include a code generator module configured to generate code based on the block diagram, the code being configured to execute external to an execution engine and including a portion to log the data based on a user input to the selection module. The system can also include a logging module configured to collect data from an executing block diagram based on a user input to the selection module. The logging module can be further configured to query the simulation to determine whether a functional element of the block diagram associated with the data is executing at a particular time point.

In another aspect, there is a data structure to log data from a block diagram. The data structure includes a parent object and a plurality of children objects. The parent object corresponds to the block diagram and includes a query method to access a child object of the parent object. The plurality of children objects correspond to a plurality of respective selected data to be logged, where the selected data does not correspond to a functional logging element of the block diagram. In other examples, the plurality of children objects include a first child object and a second child object both associated with a bus including heterogeneous signals, the first child object corresponding to a first heterogeneous signal and the second child object corresponding to a second heterogeneous signal. The parent object can include a data manipulation method. The data manipulation method can include at least one of a plot method, a playback method, a maximum point identifier, and a minimum point identifier.

In another aspect, there is a method to non-intrusively log a data set within a block diagram. The method includes generating a first timing identifier for a first data set based on a timing characteristic of the first data set, associating the first data set with a first task identifier established by an execution engine, and logging data associated with the first data set based on the first timing identifier and the first task identifier. In other examples, the method can also include determining a checksum based on the timing characteristic.

The method can also include generating a second timing identifier for a second data set based on a timing characteristic of the second data set, and associating the second data set with a second task identifier established by an execution engine. The method can also include associating the first data set with the second data set if the first task identifier is equal to the second task identifier. The method can also include associating the second data set with the first data set if the first timing identifier is equal to the second timing identifier. The method can also include generating a data structure including the first and second timing identifiers and the first and second task identifiers, and determining a data point for logging using the data structure. The data structure can include a table.

The method can also include generating a time vector associated with the first data set. The time vector can be saved in a compact format. The compact format can include at least three of a start time, a stop time, an interval, and number of elements. The method can also include generating an event buffer associated with the data. The method can also include modifying an event element in the event buffer when an associated circular data buffer overwrites existing data. The method can also include querying the execution engine executing the block diagram to determine whether a functional element of the block diagram associated with the first data set is executing at a particular time point.

In another aspect, there is a system including a storage device, a timing identifier generator, and a logging module. The storage device includes a block diagram. The timing identifier generator generates a first timing identifier for a first data set associated with the block diagram based on a timing characteristic of the first data set. The logging module is configured to associate the first data set with a first task identifier established by an execution engine and to log data associated with the first data set based on the first timing identifier and the first task identifier. In other examples, the first timing identifier can include a checksum. The system can also include a comparator module configured to associate the first data set with a second data set if the first task identifier is equal to a second task identifier associated with the second data set. The system can also include a comparator module configured to generate a pointer to use with a second data set that points to the first data set if the first timing identifier is equal to a second timing identifier corresponding to the second data set and a source of the first data set is also the source of the second data set.

The logging module can be further configured to generate a time vector associated with the first data set. The logging module can be further configured to query the execution engine executing the block diagram to determine whether a functional element of the block diagram associated with the first data set is executing at a particular time point. The storage device can further include a data structure including the first timing identifier and the first task identifier, where the logging module is further configured to determine if a data point is available for logging using the data structure. The data structure can include a table.

In another aspect, there is an article comprising a machine-readable medium that stores executable instruction signals that cause a machine to perform one or more of the above-described methods.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
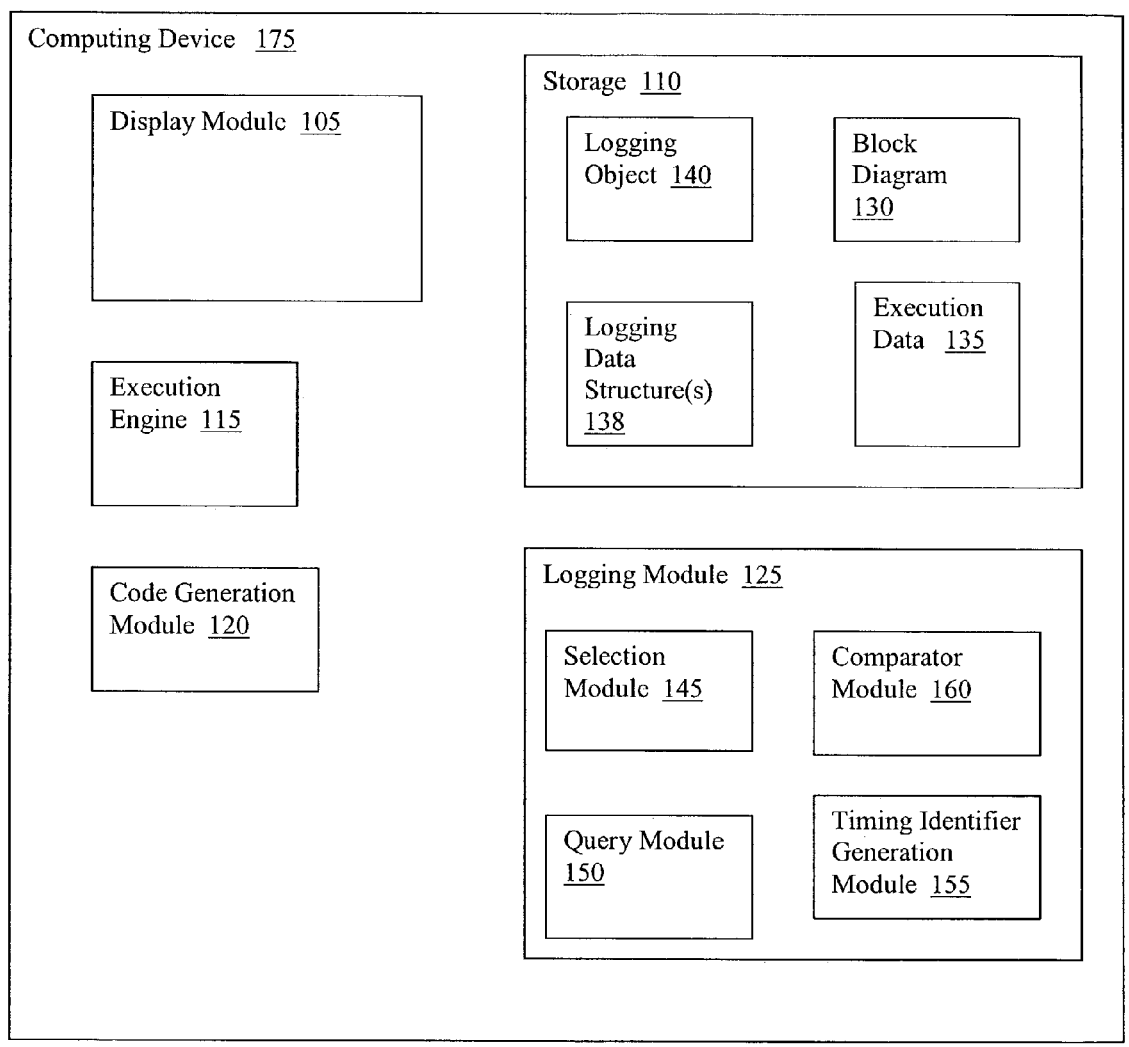
FIG. 1 is a block diagram of an example of a system to non-intrusively log data.

FIG. 1 illustrates an example system 100 that non-intrusively logs data. As described below, a user does not have to use a function element in the user's block diagram to cause the system 100 to log data related to the execution of that block diagram for user review at a later time. As illustrated, system 100 includes a display module 105, a storage device 110, an execution engine 115, a code generation module 120, and a logging module 125. Generally, the modules/components of system 100 represent hardware (e.g., monitors, processors, memory, communication busses, storage devices, FPGAs, ICs, and the like) and software (e.g., executable code, source code, data files, and the like) that perform the automated processes described herein.

More specifically, storage device 110 can represent for example, memory devices, disk drives, CD drives, USB flash memory devices, and/or other storage devices that temporarily and/or persistently store data. As illustrated, storage device 110 includes a block diagram 130, execution data 135, logging data structures 138, and a logging object 140. Block diagram 130 represents the model of the system that the user wants to simulate. Execution data 135 represents the storage area in which execution engine 115 stores data while executing a block diagram 130 (e.g., performing a simulation). As described in more detail below, execution data 135 is where logging module 125 obtains data that the user has selected to log while execution engine 115 executes block diagram 130.

Logging data structures 138 are data structures, as described in more detail below, that logging module 125 uses when logging data. In one example, logging data structures 138 is a portion of execution data 135. Logging object 140 represents the data structure in which logging module 125 stores data it obtains from execution data 135 while execution engine 115 executes block diagram 130.

Logging module 125 includes a selection module 145, a query module 150, a timing identifier generation module 155, and a comparator module 160. Selection module 145 represents the hardware and/or software that determines which signals of the block diagram 130 that the user wants to log. Query module 150 represents the hardware and/or software that queries execution engine 115 while executing block diagram 130 to determine whether a functional element associated with the signal the user wants to log is being executed at that particular time point. Timing identifier generation module 155 represents the hardware and/or software that generates a timing identifier associated with the signal that the user wants to log. Comparator module 160 uses the timing identifiers to determine, for example, whether different signals may have the same source of data, thus allowing for an optimization of data by eliminating duplicate storage in logging object 140.

As illustrated in FIG. 1, computing device 175 includes all of the components 105, 110, 115, 120, 125, 130, 135, 140, 145, 155, and 160. In other examples, however, the components 105, 110, 115, 120, 125, 130, 135, 140, 145, 155, and 160 can be distributed over a plurality of computing devices (not shown). In such examples, the components 105, 110, 115, 120, 125, 130, 135, 140, 145, 155, and 160 can communicate with each other over a network (not shown), such as an intranet or the Internet.

TABLE 1

| Host/Server | Target/Client |
|---|---|
| Display Module 105 | |
| Execution Engine 115 | Real-Time Execution Engine |
| Code Generation Module 120 | |
| Block diagram 130 | |
| Execution data 135 | Real-Time Execution Data |
| Logging Object 140 | Real-Time Logging Object |
| Selection Module 145 | |
| Timing Identifier Generation Module 155 | |
| Comparator Module 160 | |

In one example client/server configuration (e.g. Simulink's External Mode, manufactured by The MathWorks, Inc. of Natick, Mass.), the components of computing device 175 are split between client and server as described in Table 1. Notice that in the client/server configuration, execution engine 115, execution data 135, and logging object 140 have corresponding modules real-time execution engine, real-time execution data, and real-time logging object, respectively. The real time modules provide the data space for and management of the target program. A communication link (e.g., Simulink's External Mode) provides a mechanism for communicating real-time data to the host program and populating the appropriate memory locations of execution data 135. Once execution data 135 receives data from the real-time execution data module on the target, execution engine 115 is allowed to execute (e.g., perform the next time step). In other words, the execution engine 115 is generally independent from the source of the data and only requires a fully formed data space on which to operate. Similarly, data is transferred across the communication link between logging object 140 and the real-time logging object. The relationship between the real time modules and their corresponding modules 115, 135 and 140 can be considered as master to slave relationship, since the real time modules are generating data and governing execution while the modules 115, 135, and 140 are being driven by the data transfer via the communication link.

Figure 2:
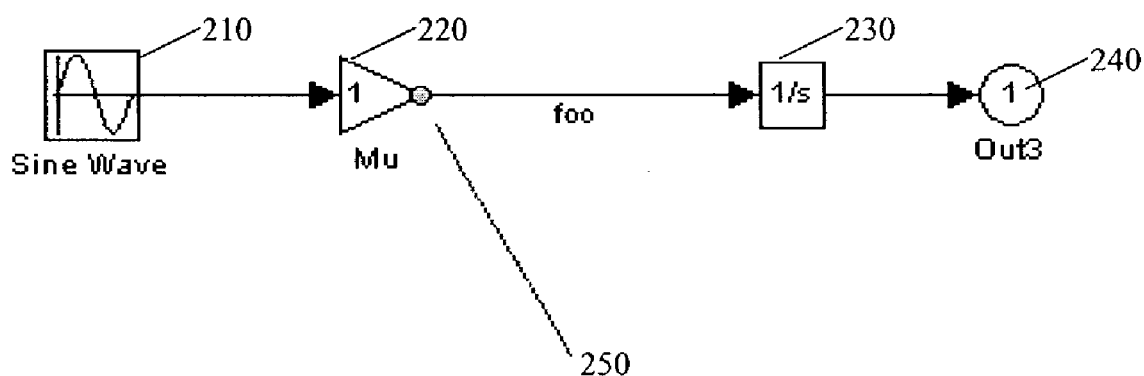
FIG. 2 is a block diagram of an example of a block diagram.

FIG. 2 illustrates an example block diagram of a visual representation of block diagram 130 (FIG. 1). Block diagram 130 includes functional elements 210, 220, 230, and 240. Functional element 210 models a sine wave generator. The output of functional element 210 connects to functional element 220. Functional element 220 models an amplifier with unity gain. The output of functional element 220 connects to functional element 230. Functional element 230 models an integrator. The output of functional element 230 connects to functional element 240. Functional element 240 models an output port of the system.

Graphical element 250 is an optional, non-functional indicator (e.g., a non-functional graphical affordance) that indicates that the output of functional element 220, illustrated as the signal "foo", has been selected by the user to be logged. Graphical element 250 serves as a visual clue to the user that a signal will be logged, but execution engine 115 does not compile graphical element 250 when compiling block diagram 130 for simulation. In other words, graphical element 250 simply indicates to the user that logging module 125 logs signal "foo" into logging object 140 when execution engine 115 executes block diagram 130, but logging module 125 works the same with or without graphical element 250 being displayed.

Figure 3:
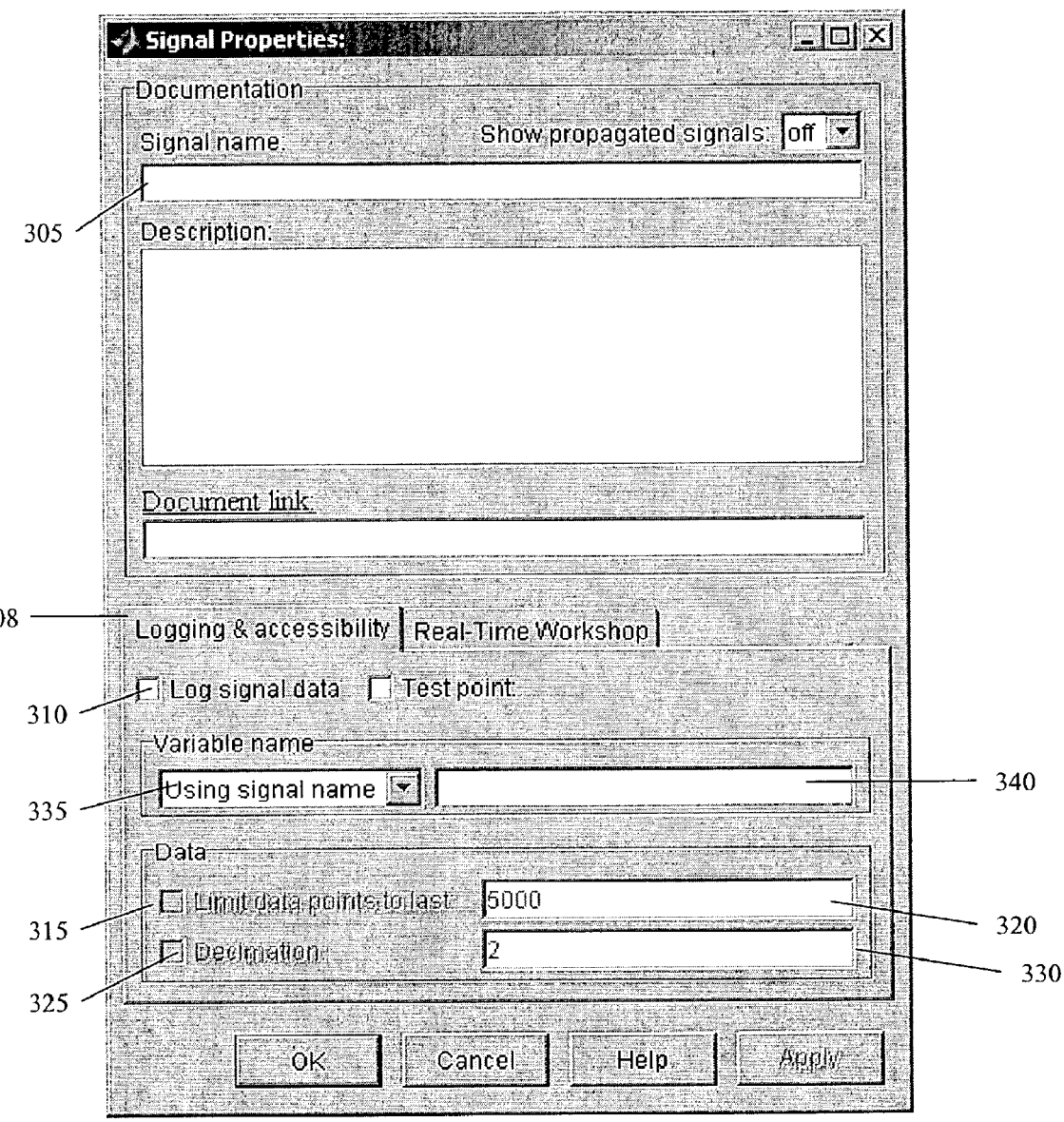
FIG. 3 is a screen shot of an example user interface to enable a user to select logging of desired signals.

In one example, to select a signal to be logged, the user can move a cursor over the inputs and outputs of a functional element and perform a right-click (i.e., click the right-most button on a mouse input device). For example, to log signal "foo", the user right-clicks on the output line of functional element 220, labeled "foo". FIG. 3 illustrates an example of a user interface 300 that system 100 generates when the user right-clicks on a signal. User interface 300 enables the user to select and enter values for various attributes of a signal for controlling logging without having to add a functional element to block diagram 130.

In user interface 300, the signal name of the signal appears in box 305. The user uses the 'logging and accessibility' tab 308 enable/disable logging for the named signal and set associated logging properties for that signal, such as a maximum number of data points and decimation. The user uses check box 310 to indicate to system 100 whether the user wants to log that signal. A mouse click on check box 310 adds a check to box 310 and changes a property associated with that signal. For example, if the user right-clicks on "foo" and system 100 generates user interface 300 with signal name "foo" in box 305. The user checks box 310 to change the value of a property to log data associated with the signal "foo" (e.g., using pseudo code such as set_property (model130.functional_element220.signal_foo.log_data= TRUE)). As described below, logging module 125, for example using selection module 145, uses the value of the "log_data" property to generate a signal list of signals to be logged when executing block diagram 130.

User interface 300 also allows the user to enter values of properties to define how much data the user wants to log for that particular signal. Check box 315 allows the user to select whether the user wants a limit on the number of data points saved while executing. If the user does want to limit the number of data points (e.g., checks box 315), then box 320 allows the user to input a maximum number of data points to be logged. For example, if the user enters 5000 into box 320, then once 5000 data points have been logged, logging module 125 begins to overwrite the oldest data points with the new data points so that in the end, only the last 5000 data points are logged. When the user checks box 315 and enters a value into box 320, system 100 can make the changes to the property of the signal using, for example, pseudo code such as set_property (model130.functional_element220.signal_foo.max_points= 5000).

Similarly, check box 325 allows the user to select whether the user wants decimation on the number of data points logged while executing. In other words, does the user want to only log every $n^{th}$ data point generated by execution engine 115 for that signal. If the user does want to set a decimation value for the logged data points (e.g., checks box 325), then box 330 allows the user to input a decimation value. For example, if the user enters 2 into box 330, then logging module 125 logs every $2^{nd}$ data point generated by execution engine 115 for that signal. When the user checks box 325 and enters a value into box 330, system 100 can make the changes to the property of the signal using, for example, pseudo code such as set_property (model130.functional_element220.signal_foo.decimation=2).

As the example described above, logging module 125 logs signal "foo" into logging object 140. Logging object 140 includes a parent object associated with block diagram 130. Logging object 140 also includes one or more children objects, where the children objects corresponded to each of the signals logged while executing block diagram 130. Input box 335 enables the user to select a name for the child object that corresponds to the signal being logged. As illustrated, box 335 includes a pull down menu so the user can select to use the name of the signal as labeled in block diagram 130 (i.e., the signal name that appears in box 305). Box 335 also allows the user to input a custom name that may have more meaning to the user when the user is reviewing the data in logging object 140 in the future. For example, for the output signal of functional element 220, the user can label the data in logging object 140 "foo" by selecting "foo" from the drop down list of box 335. If the user selects the same name, logging module 125 logs signal "foo" in a child object, also named foo, in logging object 140. The user may alternatively select to customize the name of the logged signal, for example, by selecting custom from the dropdown list of box 335 and entering "220_Output" into box 340. If the user selects the name "220_Output", logging module 125 logs signal "foo" in a child object named "220_Output", in logging object 140. When the user selects using box 335 and, if applicable, enters a value into box 340, system 100 can make the changes to the property using, for example, pseudo code such as set_property (model130.functional_element220.signal_foo.log_name= "220_Output").

The user interface 300 can also include a feature (not shown) that enables the user to define one or more groups of signals to be logged. The user defines each group by selecting each of the signals that are to be logged for that group. At execution time, the user can select a predefined group and logging module 125 logs all the signals associated with that group. The defined group or groups can be saved with the block diagram 130 so that the user does not have to enter the data for each signal as described above. Also, the groups allow logging of the same signal using different property values. For example, the user can define group 1 that includes the signal "foo" with a maximum of 5000 data points and a decimation of 2 and define a group 2 that includes the signal "foo" with a maximum of 1000 data points and a decimation of 5. The user can also define a group 3 that does not include the signal "foo". The user can also define a group 4 that includes group 2 and group 3. System 100 also enables the user to dynamically select the signals and/or groups to be logged while execution engine 115 is executing the block diagram 130. The user can make this dynamic selection using a variety of interfaces including, for example, user interface 300, command line functions, global object inspectors, and other object specific dialogs. When the user makes a dynamic selection, system 100 dynamically updates the applicable properties of effected signals and dynamically updates logging data structures 138.

Figure 4:
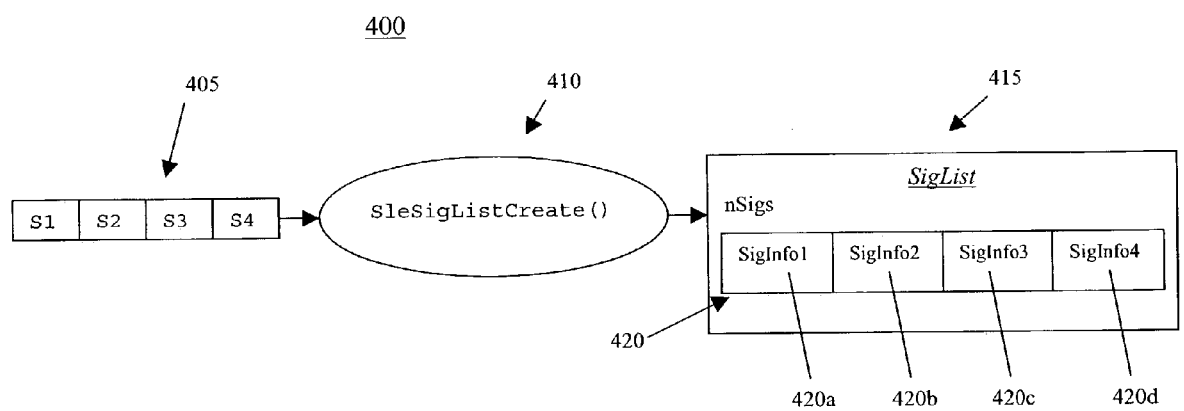
FIG. 4 is a block diagram of an example process to generate a signal list of desired signals for logging.

With the signals selected by the user, logging module 125 generates a signal list from the selected signals, using for example selection module 145. In one example, logging module 125 queries the properties of the signals of functional elements 210, 220, 230, and 240 to determine whether the properties corresponding to the logging of a signal have been set to a value to indicate that logging is requested. For example, referring to the pseudo code described above, logging module queries signal properties of functional elements 210, 220, 230, and 240 to determine whether log_data=TRUE for any of the signals. FIG. 4 illustrates the process of generating a signal list. Through the querying example above, by using the currently selected predefined group or any other similar method, logging module 125 determines which of the signals in the block diagram 130 the user has selected for logging. The logging module 125 generates an array 405 that includes each of the signals (e.g., in the illustrated example S1, S2, S3, and S4) that the user has selected for the logging module 125 to log during a while executing. Logging module 125 performs a method 410 (e.g., pseudo code SleSigList-Create( )) that uses array 405 as an input and generates signal list 415 as an output. Signal list 415 includes an array 420 that corresponds to input array 405. Method 410, in generating array 420, determines additional information about each corresponding signal, so that logging module 125 can find the data for each of the signals. As shown, array element 420a includes additional information about signal S1, array element 420b includes additional information about signal S2, array element 420c includes additional information about signal S3, and array element 420d includes additional information about signal S4.

Figure 5:
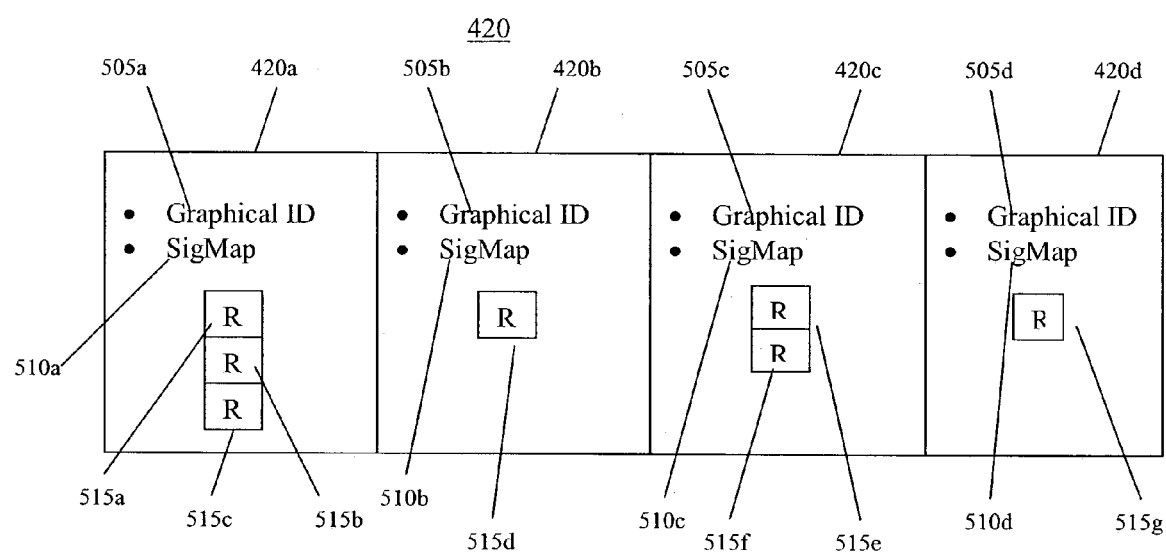
FIG. 5 is a block diagram of an example data structure of an array included in the signal list of desired signals.

FIG. 5 illustrates a graphical representation of array 420, including examples of additional information within the elements of array 420. As illustrated, each element of array 420 contains a graphical identifier 505 and a signal map 510. Graphical identifier 505 is the identifier of the signal that is used in the graphical representation of block diagram 130, as rendered to a user. For example, the output of functional element 220 is labeled "foo" and so foo is the graphical identifier for that signal. Signal map 510 identifies the one or more regions 515 representing the source of data that is included in the signal identified by the graphical identifier 505. For example, this could include the region(s) of memory in execution data 135 that hold the corresponding data.

Figure 6:
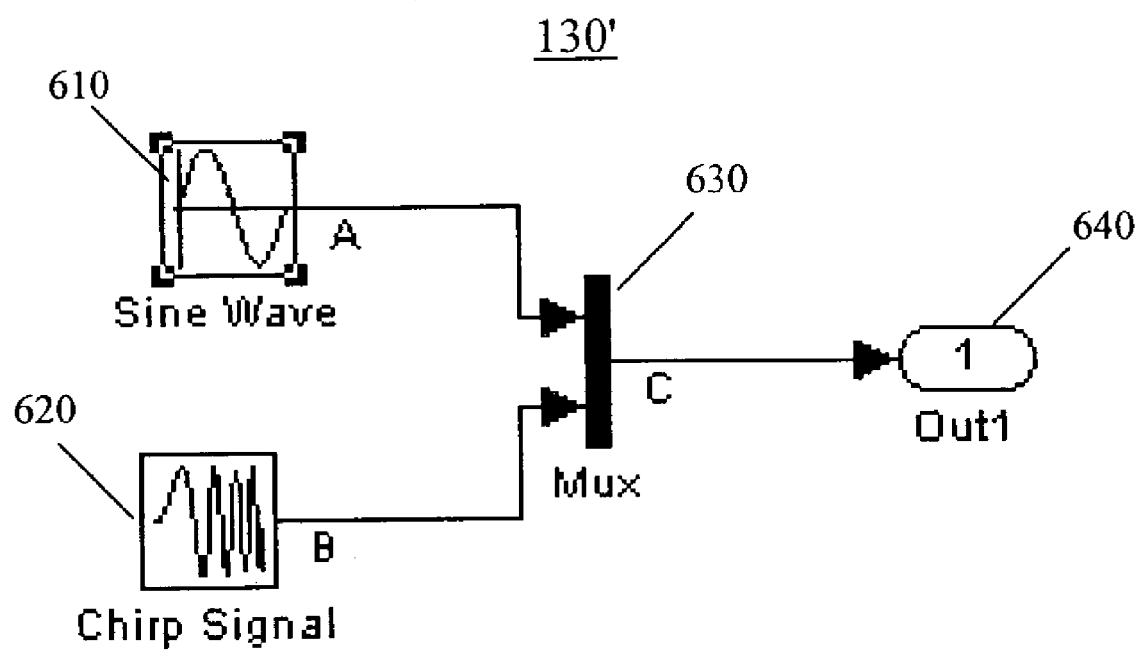
FIG. 6 is a block diagram of another example of a block diagram.

To illustrate the regions 515 in more detail, FIG. 6 illustrates another example block diagram of a visual representation of a block diagram 130'. Block diagram 130' includes functional elements 610, 620, 630, and 640. Functional element 610 models a sine wave generator. The output of functional element 610 has a graphical identifier "A" and connects to functional element 630. Functional element 620 models a chirp signal generator. The output of functional element 620 has a graphical identifier "B" and connects to functional element 630. Functional element 630 models a switching/combining element. The output of functional element 630 has a graphical identifier "C" and connects to functional element 640. Functional element 640 models an output port of the system. Because the functional element 630 has input from two different sources, the output of functional element 630 can contain heterogeneous signals. The heterogeneous signals can include data of different types, different formats, and/or different timing characteristics.

Figure 7:
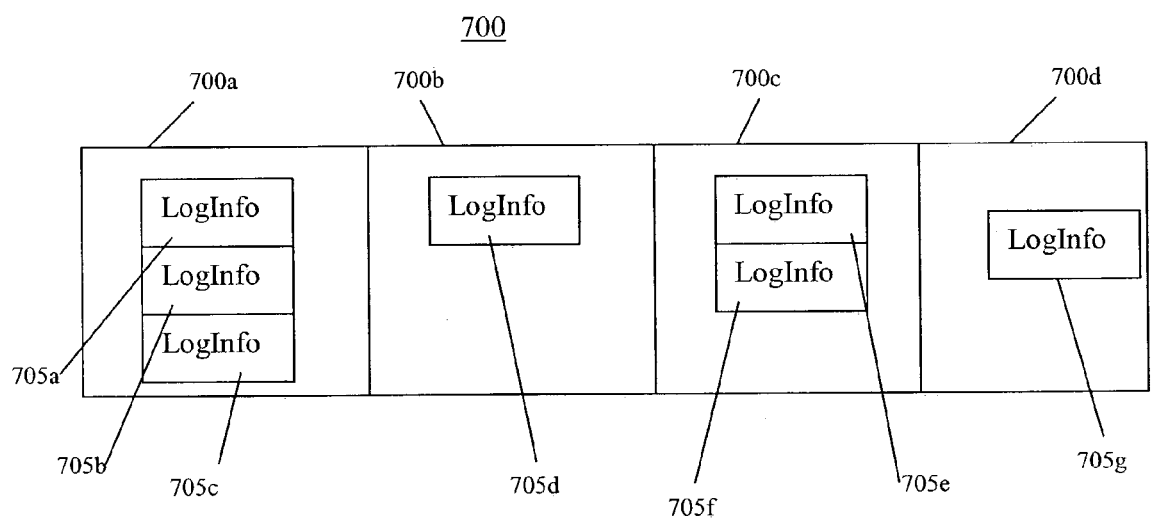
FIG. 7 is a block diagram of an example data structure used in a non-intrusive logging process.

Referring to both FIGS. 5 and 6, array element 420c can represent the output of function element 630. Graphical identifier 505c is "C", the graphical name of the signal for the output of functional element 630. Signal map 510c includes two regions, 515e and 515f. As described above, regions 515 represent the source of the data for a particular signal. In the case of signal functional element 630, which is simply a switching/combining element, the source of its signal comes from its two inputs, labeled with graphical identifiers "A" and "B". In this example, the execution engine 115 does not define a separate memory location for storing "C" since "C" is "A" and/or "B" at all times. So, region 515e corresponds to the first source "A" for signal "C" and region 515f corresponds to the second source "B" for signal "C". Because array element 420c defines signal "C" by its sources, there is not a problem logging signal "C" even if signals "A" and "B" are heterogeneous, because logging module 125 logs the sources "A" and "B" independently as described below, using array 700 (FIG. 7).

The additional information that region 515 includes is a source identifier, a source pointer, a defined number of elements, a data type, and a complexity. The source identifier is an identifier of the source of the signal. In this example, region 515e has a value of "A" for the source identifier and region 515f has a value of "B" for the source identifier. The source pointer is a pointer to the start of the memory location in which the source data resides. In this example, region 515e has a value of the memory location at which data for signal "A" starts and region 515f has a value of the memory location at which data for signal "B" starts. The defined number of elements represents the number of elements to copy (e.g., the number of data points) and this can be based on, for example, the decimation value. The data type represents the data type of the signal and logging module 125 uses the data type to determine the number of bytes needed to copy the desired data points. The complexity represents whether the data of the signal is a complex signal (made up of several components) and logging module 125 also uses the complexity to determine the number of bytes needed to copy the desired data points.

As illustrated in FIG. 5, array 420 includes the additional information that describes where logging module 125 can find the source data for each of the signals that the user wants logged. FIG. 7 illustrates a corresponding array 700 that logging module 125 generates to provide additional information about logging the signal data. As illustrated, array 700 includes four elements 700a, 700b, 700c, and 700d that correspond to elements 420a, 420b, 420c, and 420d, respectively. Similarly, each element 700a, 700b, 700c, and 700d includes one of more log information blocks 705 that correspond to the regions 515 of each element 420a, 420b, 420c, and 420d of array 420.

The log information blocks 705 include the name of the logging variable, the name of the source, the index of the source, name of the signal being logged, name of the graphical parent, and LogVar properties, which are properties of the data buffer in which the data is temporarily stored until logging module 125 writes the data to the logging object 140. The name of the logging variable includes the name that the user assigns, for example, using box 335 of user interface 300 as described above. For example, the user can name the logging variable "Output of 730" for signal "C" of FIG. 7. The logging variable name can be the same as the graphical identifier of the signal or it can be different, and the child object that logs the signal data is assigned the logging variable name. The name of the source includes the graphical identifier of the source. Logging module 125 obtains this information from the corresponding region 515 in array 420. For example, for log information block 705e, corresponding to region 515e, the source is "A". The index of the source is 1, representing the first output port of sine wave block 610. The name of the signal being logged includes the graphical identifier of the signal. For example, for log information block 705e, corresponding to region 515e, the name of the signal is "C". The name of the graphical parent includes the graphical identifier of the signal that is being generated by the source. For example, for log information block 705e, corresponding to region 515e, the graphical identifier of the parent is "C". The graphical parent can be identical or different from the graphical identifier of the signal. For example, where the signal is "C", the graphical parent is also "C". If signal "A" is extracted from signal "C", the signal name is "A" but the parent is "C". The LogVar properties of the data buffer can include information such as memory locations for a circular buffer, which can be based on a limit of data points, a decimation hit counter, and other buffers needed for transitory storage of execution data until logging module 125 determines to persist the data, or portions thereof, to logging object 140.

Figure 8:
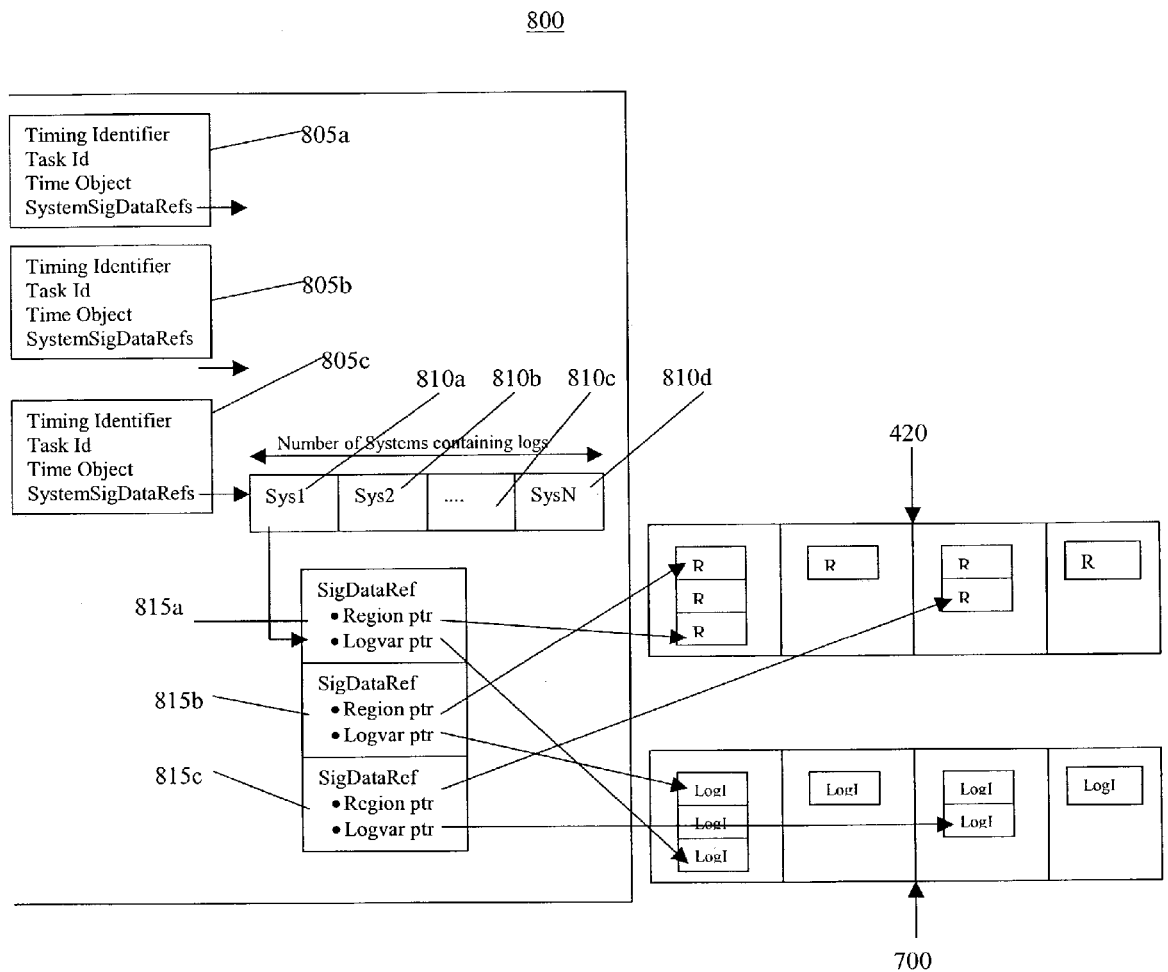
FIG. 8 is a block diagram of another example data structure used in a non-intrusive logging process.

In addition to information about where to find data associated with a signal (e.g., array 420) and where to log data associated with a signal (e.g., array 700), logging module 125 needs information about when to obtain the data. FIG. 8 illustrates a data structure 800 that includes additional information about timing. As illustrated, data structure 800 is a multi-dimensional table. Each row of data structure 800 includes a timing element 805. Each timing element 805 includes a timing identifier, a task identifier, a time object, and a system signal reference list. The timing identifier is a identifier based timing characteristics and provides a mechanism that enables logging module 125 to associate all signals with identical (or substantially identical) timing characteristics for efficient use of needed overhead resources (e.g., circular buffers, decimation counters, and the like) when logging data.

The task identifier is a unique identifier that the execution engine 115 assigns to a rate group used in an execution of block diagram 130. The time object includes information that summarizes the characteristics of a timing vector that will be generated for a particular timing identifier when data is logged. For example, the time object may include a start time, a stop time, an interval period, and the number of elements. The system signal reference list contains one or more columns 810, where each column 810 identifies a system and/or sub-system of block diagram 130 that contains a signal associated with that particular timing element (e.g., columns 810a, 810b, 810c, and 810d are associated with timing element 805c). A system of block diagram 130 can include one or more functional elements of a block diagram that act as a single unit.

Although grouping signals by systems and/or sub-systems is not necessary, one advantage of this portion of data structure 800 is that logging module 125 can easily identify associations between signals and systems to perform additional logging associated with specific systems. For example, an iterator subsystem performs multiple iterations at a single time step, but each iteration overwrites the previous interation in execution data 135. If logging module 125 retrieves data at the end of the time step, logging module 125 logs the final interation. If logging module 125 determines that a signal is part of an iterator system, logging module 125 can log data at each iteration, before it is overwritten. To do this quickly, logging module 125 identifies which of the systems included in columns 810 are iterator systems and then logs the signals associated with those signals. Without such categorization, logging module 125 has to query each of the signals the user has selected to log to determine whether that signal is associated with an iterator system.

Each system column 810 includes one or more sub-rows 815 (e.g., column 810*a* includes sub-rows 815*a*, 815*b*, and 815*c*). Each sub-row 815 corresponds to a signal the user has selected to be logged and includes signal reference data. In this way, logging module 125 associates each signal to be logged with one of the timing elements 805, by including the signal reference data 815 of corresponding to that signal in the system signal reference list 810 of a particular timing element 805. The signal reference data 815 includes a region pointer and a logging pointer. In one example, the region pointer points to the applicable region 515 of array 420 that corresponds to that signal and the logging pointer points to the applicable log information 705 of array 700 that corresponds to that signal.

As illustrated, data structure 800 establishes rows based on the value of the timing identifier of the timing element 805. Logging module 125, using for example timing identifier generation module 155, generates a timing identifier for a signal based on one or more timing characteristics of that signal. The timing identifier has a uniqueness that is based on values of one or more timing characteristics. In other words, the timing identifier is different for those signals having different values for the one or more timing characteristics on which the timing identifier is based and the timing identifier is identical for those signals having identical values (or substantially identical values, with respect to logging data, as described below) for the one or more timing characteristics on which the timing identifier is based. In one example, the timing identifier of a timing element 805 includes a timing checksum calculated from the values of the one or more timing characteristics, such as the three timing characteristics described below.

One timing characteristic logging module 125 can use to determine a timing identifier is a time period value between time steps of data generated by execution engine 215. If the time period is identical, then the timing identifier is identical. For some signals, however, even if the time period is identical, the signals can have different task identifiers because, for example, some may execute at only major steps where others execute at both major and minor steps. For purposes of logging data, however, the timing identifier can be identical even if the task identifier is different.

For example, timing identifiers generated for a continuous signal and a zero-order-hold ("ZOH") continuous signal are identical, even though the task identifiers for the signals are not. During execution, time steps include major steps and minor steps. ZOH-continuous sample times refer to functional elements of a block diagram that do not change output values during minor steps. Continuous signals change output values at major and minor steps. Time points and data points for continuous signals, however, are 'posted' at major steps. If logging module 125 logs posted output values, then data logging is a major step activity for continuous signals. As such, continuous and ZOH-continuous blocks can be treated identically by logging module 125 because they are both logged at major steps. Similarly, a continuous signal and a discrete signal can also have identical timing identifiers, even though one is continuous and one is discrete. Consider a fixed step model with a step size of 1 that contains a continuous block and a discrete block of sample time 1. Since the continuous element runs at a fixed step size of 1, the major output behavior, with respect to generating and logging data, of the continuous and discrete block are identical. As such, they are treated to be of the same sample time for the purposes of sharing time vectors, so logging module 125 generates identical timing identifiers for each of them.

Another timing characteristic logging module 125 can use is an event context. If signals are dependent on different events, then logging module 125 generates different timing identifiers for each of the signals. In other words, two signals identical in all characteristics other than their conditionally executed context have different timing identifiers. Another timing characteristic logging module 125 can use is a variable sample time identifier. Variable sample times are discrete functional element blocks that run at non-regular intervals, typically having an offset. Each variable sample time has a unique id encoded into the offset field of its sample time record. Logging module 125 uses this unique id to generate different timing identifiers for each different variable sample time.

Logging module 125 uses data structure 800 to determine when execution engine 115 is calculating a new value for a signal. To do this, logging module 125, using, for example, query module 150, queries execution engine 115. In more detail, at a particular task identifier (i.e., a particular rate group being executed), execution engine 115 includes a routine that allows logging module 125 to execute a query into whether a functional element, associated with that task identifier, is executing at this calculation time point. So for each signal 815 in each system 810 associated with a timing element 805 having that particular task identifier, logging module 125 makes the query. If the reply from execution engine 115 is in the affirmative, logging module 125 obtains the data from the appropriate location(s) from execution data 135. As described above, logging module 125 uses the region pointer in the signal data reference 815 to obtain the corresponding region 515 that has the location information for that signal. If the reply from execution engine 115 is in the negative, logging module 125 moves on to the next signal.

Figure 9:
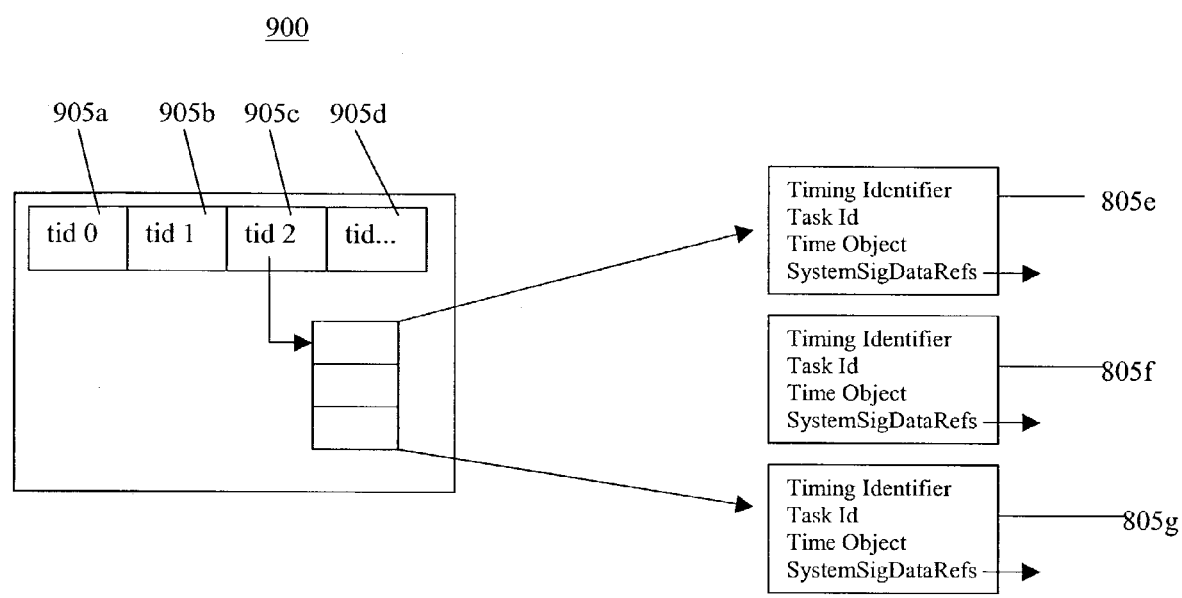
FIG. 9 is a block diagram of another example data structure used in a non-intrusive logging process.

As described above, the timing identifier is based on timing characteristics of a signal and the task identifier is an associated rate group defined by execution engine 115. As such, the two are not identical. Further, timing elements 805 with different timing identifiers can have the same task identifiers. Because logging module 125 uses the task identifiers to generate queries, FIG. 9 illustrates another data structure 900 that logging module 125 can use in addition or as an alternative to data structure 800. As illustrated, data structure 900 establishes columns 905 based on the value of the task identifier of the timing element 805. Each column has one or more rows that include the timing elements 805 that are associated with the task identifier of that column 905.

Using data structures described above, logging module 125 can execute the following data collection algorithms to log data. This logic happens at the end of every execution step. The first part of the pseudo code to illustrate the example algorithm is:

```
loop over tid table {
    if isHit(tid) {
        updateLogVar(tid)
    }
}
``` where tid represents the task identifier. The updateLogVar (tid) routine causes logging module 125 to examine the column 905 of tid table 900 and loop over its vector of timing element rows 805. These represent the rows that potentially need updating with this tid. For the updateLogVar(tid) routine, logging module 125 performs the following pseudo code:

```
loop over rows {
    tableRow->UpdateSigAndTimeData( )
}
```

For the UpdateSigAndTimeData routine, logging module 125 iterates over each system 810 associated with the timing element 805. If that particular system 810 is active (e.g., the query described above is in the affirmative), logging module 125 iterates over the signal data reference sub-rows 815 associated with that particular system 810. Logging module 125 performs the following pseudo code:

```
loop over sysDataRefs{
    sysDataRef->UpdateData( )
}
``` where the sysDataRefs represent the associated sub-rows 815. For each sub-row 815, logging module 125 iterates over the corresponding region(s) 515 and copies data from memory location described by that region 515 to the LogVar's data buffer described by the information from the corresponding LogInfo 705. Logging module 125 performs the following pseudo code:

```
loop over regions {
    Copy(region pointer, LogVar pointer).
}
```

Logging module 125 also updates the time data using the following pseudo code:

UpdateTimeData(t)

Here, logging module 125 adds a time point to the log buffer. In this example, the time buffer has the same length and decimation properties as the associated data buffers, so that they always remained synchronized (e.g., when the data buffer wraps, so will the corresponding time buffer). To update the event buffer, logging module 125 performs the following pseudo code:

```
UpdateEventBuffer(t,dataWrapped,newEnable)
    if(newEnable) {
        move to next element in event buffer (bump head)
        record event start time
    }
    head->nEls++; //increment # of elements in current event
    if (dataWrapped) {
        //we are losing history, must update oldest event
        tail->nEls--; //decrement # of elements in old event
        if (tail->nEls == 0) {
```

-continued

```
            //event now empty
            move tail forward (frees slot for future use)
        }
    }
``` where nEls is the number of elements associated with that particular buffer.

As described above, logging module 125 maintains and updates an event buffer. The event buffer stores timing information about events that influence a signal. For example, inside a conditionally executed subsystem, the event buffer stores timing information regarding events that trigger a condition (e.g., an enable event that makes a signal active). Logging module 125 automatically stores the timing information about events with the associated signals in logging object 140. In one example, logging object 140 includes event information for every logged signal. If the signal is not a conditional signal, the event information simply includes a start time, which is the start time of the execution, a stop time, which is the stop time of the execution and the number of elements logged for that event, which, assuming a decimation of 1, would be equivalent to the total number of elements for that signal for that execution. For a periodic signal, the event information can also include the interval between data points.

If the signal is a conditional signal, then the event buffer includes the start time, stop time, number of elements, and if applicable, the interval, for each enabling event. So, as each event occurs, logging module 125 adds another set of data to the event buffer. The event buffer grows as logging module 125 logs timing information associated with the enabling and disabling events that occur with the data. As described above, the user can limit the number of data points logged. If the user does select such a limit, for example 5000 data points, then logging module 125 can establish a circular buffer for 5000 entries to limit consumed resources. In such an example, logging module 125 synchronizes the event buffer with the data buffer so that as the circular data buffer wraps, the logging module 125 also updates the event buffer to reflect the wrapping. As noted in the pseudo code above, the logging module 125 decrements the number of elements in the first event in the event buffer as the data buffer wraps.

Referring back to the pseudo code above, the algorithm described is an example for an aperiodic signal. The algorithm for a periodic signal is almost identical to the example above except for a slight variation in the handling of the time event. Due to the periodic nature of the signals, no point-by-point time history is required. Therefore, only the entries in the circular event buffer that track event start times, stop times, and/or number of elements need to be updated to record each point in time. For example, if the period of the periodic signal is 1 second and the start time is at 3 seconds and the stop time is at 8 seconds, then the data points correspond to times 3 seconds, 4 seconds, 5 seconds, 6 seconds, 7 seconds, and 8 seconds. For efficiency in storage, there is no need to store the time points because they can be determined by storing at least three of the following parameters: the period, the start time, the stop time, and the number of elements. So for periodic signals, logging module 125 stores time vectors in logging object 140 in a compact form, storing for example the period, the start time, the stop time, and the number of elements (e.g., data points).

Another efficiency in storage can be obtained by determining whether any signals are identical. If logging module 125 determines that two or more signals are identical, for example, have the same timing characteristics and share the same source, logging module 125 stores the data for one signal and stores pointers to that data for all of the other identical signals sharing that same source. For example, referring back to FIG. 6, the output of functional element 630, labeled "C", is identical to the output of functional element 610, labeled "A" if the user selects the same timing characteristics (e.g., logging, decimation and the like) for each signal. Logging module 125 can log the data for signal "A" and then simply log a point for signal "C" that points to the data logged for signal "A". Similarly, referring back to FIG. 2, the output of functional element 220, labeled "foo", is identical to the output of functional element 210 because element 220 is unity gain. Here again, if the user selects both signals for logging and the timing characteristics are substantially identical, logging module 125 logs the output of functional element 210 and logs a pointer for signal "foo" pointing to the data logged for functional element 210.

Figure 10:
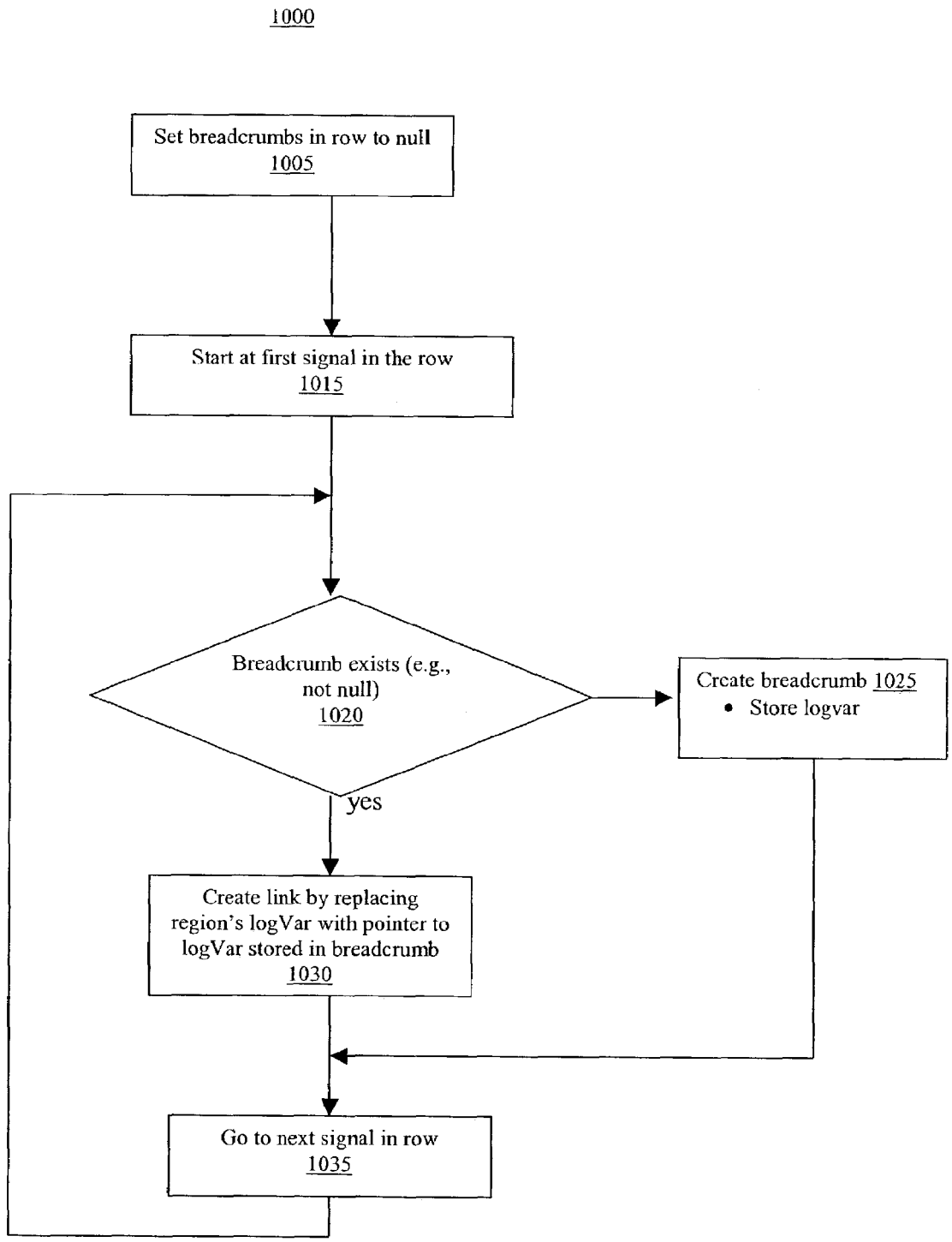
FIG. 10 is a block diagram of an example process to identify duplicate data for logging.

FIG. 10 illustrates an example process 1000 that logging module 125 performs to determine whether signals are identical and to store a pointer for all identical signals to the first signal that contains the logged data. Referring to data structure 800, logging module 125 iterates process 1000 over each of the rows 805 of data structure 800. As described above, the rows of data structure 800 are sorted based on the timing identifier. So, if a signal shares the same timing characteristics as another signal, they have the same timing identifier and thus are in the same row (i.e., have the same row identifier). This prevents a pointer when, for example, a user selects signal "foo" to be logged at a different decimation than the output of functional element 210.

In process 1000, a "breadcrumb" includes a parameter for a LogVar pointer. In one example, logging module 125 stores the breadcrumb in a region 515 (FIG. 5). The logging module 125 sets (1005) the breadcrumb parameters for the signals of that row to null. Logging module 125 starts (1015) at the first signal in that row. Logging module 125 determines (1020) whether a breadcrumb exists. For example, logging module 125 queries the signal to see if its breadcrumb is null or whether a value for its LogVar parameter has been defined. If the breadcrumb is empty (e.g., set to null), then this is the first "copy" of the signal data. Logging module 125 generates (1025) the breadcrumb by storing the LogVar pointer that corresponds to that region.

If the breadcrumb is not empty, then the user has requested redundant logging of this data. Logging module 125 copies (1030) the LogVar pointer stored in the breadcrumb to the LogVar pointer associated with the region that is at the current element of the list. For example, the region of element 610 (FIG. 6) is region "A". The region of element 630 is defined as region "A" and region "B". When logging module 125 first encounters signal "A" and queries its region, logging module 125 determines (1020) that the breadcrumb is null. As logging element 125 encounters signal "C", logging element determines that the region for "C" points to region "A". When logging element 125 queries region "A", logging element 125 determines (1020) that the breadcrumb has already been set. Logging module 125 creates (1030) a link by setting the LogVar pointer of signal "C" to that of signal "A". Logging module 125 repeats actions 1020-1035 for each of the signals in the row.

Referring back to FIG. 1, code generation module 120 generates stand-alone code (e.g., C code) to execute block diagram 130. User interface 300 (FIG. 3) enables a user to change values of properties of functional elements (e.g., 210, 220, 230 and 240 (FIG. 2)) of block diagram 130. When code generation module 120 generates stand-alone code, code generation module 120 uses the values set by user interface 300 to include in the stand-alone code portions that generate logging object 140. In one illustrative example, the desired logged signal is the output of functional element 230. Using user interface 300, the user sets the log_data property for signal "foo" to TRUE, the signal name for the corresponding child object in logging object 140 to "foo", the limit of data points to 5000 and the decimation to 2. When code generation module 120 generates the stand-alone code, code generation module 120 uses these set values so now when the generated code is executed, the code generates a logging object 140' that has a child object "foo" that records a maximum of the 5000 latest data points of the output of functional element 220 using a decimation of 2.

As described above, logging object 140 includes children objects corresponding to the signals that logging module 125 logs to the logging object. The logging object 140 has several properties and methods that enable the user to access and manipulate the data stored in logging object 140. For example, the user can query logging object 140 to obtain a listing of the signals that are logged within logging object 140. Logging object 140 also includes properties and methods of/associated with this object to aid in post processing and analysis of the data, such as plot, playback, max, min, and the like.

A number of embodiments of the invention have been described. Nevertheless, it will be understood that various modifications may be made without departing from the spirit and scope of the invention. For example only and not to limit the scope of alternative variations, the following variations are included. Although the example above used signals for data to be logged, the user can log any time varying data including, for example, input signals, output signals, and internal states of functional elements 210, 220, 230, and 240. Although the examples above use a block diagram, any graphical environment that describes or models time varying behavior, for example, general graphical programming tools, data flow tools, control design tools, dynamic simulators, tools that model reactive systems, and the like, can be used. Although the examples above used an object-oriented paradigm for some example data structures, other non-object data structures can be used. Although a particular user interface was illustrated and described, other types of user interfaces can be used, including command line functions, global object inspectors, and other object specific dialogs. Accordingly, other embodiments are within the scope of the following claims.

What is claimed is:

1. A computer implemented method comprising:
   simulating an executable block diagram having one or more functional blocks representing aspects of a system being modeled; and
   during simulation of the block diagram, logging data related to the simulation of the block diagram into a storage device without using a functional logging block within the block diagram, the logged data being available after completion of the simulation.

2. The method of claim 1 further comprising querying an execution engine executing the block diagram to determine whether a functional element of the block diagram associated with the data is executing at a particular time point.

3. The method of claim 1 further comprising:
   setting a value of a property of a data structure associated with a functional element of the block diagram to indicate logging of the data associated with the functional element.

4. The method of claim 3 wherein the data structure comprises an object.

5. The method of claim 3 further comprising generating code from the block diagram, the code being configured to execute external to an execution engine and including a portion to log the data associated with the functional element based on the value of the property.

6. The method of claim 1 wherein the data is a first data set, the method further comprising
determining if the first data set is equivalent a second data set; and
generating in a log for the second data set an association with the first data set if the first data set is determined equivalent to the second data set.

7. The method of claim 6 wherein generating further comprises:
generating a pointer to the first data set; and
storing the pointer with the second data set.

8. The method of claim 1 further comprising
generating the block diagram using functional graphical elements; and
rendering a non-functional graphical affordance to indicate the data to be logged.

9. The method of claim 1 wherein the data corresponds to a signal at an input port, a signal at an output port, or an internal state of a functional element within the block diagram.

10. The method of claim 1 further comprising:
generating a destination object to log the data;
associating a location in the destination object with the data; and
associating a portion of execution data with the data.

11. The method of claim 10 further comprising associating the location with the portion of execution data.

12. The method of claim 1 further comprising generating an event buffer associated with the data.

13. The method of claim 12 further comprising modifying an event element in the event buffer when an associated circular data buffer overwrites existing data.

14. The method of claim 1 wherein the block diagram is simulated on a first computing device and wherein the method further comprises:
storing a destination object on a second computing device; and
establishing a communication channel between the simulating block diagram and the destination object to transmit the data.

15. The method of claim 1 wherein the data is associated with a bus comprising heterogeneous signals.

16. A computer implemented method comprising:
simulating an executable block diagram having one or more functional modeling elements representing aspects of a system being modeled; and
generating a user interface to enable a user to select data associated with functional modeling elements to be logged into a storage device during block diagram simulation without the use of an additional functional logging element within the block diagram, the logged data being available after completion of the block diagram simulation.

17. The method of claim 16 further comprising:
simulating the block diagram on a first computing device;
rendering the user interface on a second computing device; and
establishing a communication channel between the simulating block diagram and the user interface to transmit the data.

18. The method of claim 16 wherein the data is a first data set, the method further comprising enabling the user to define one or more groups, each group comprising one or more data sets selected from a plurality of available data sets associated with the block diagram.

19. The method of claim 18 further comprising:
receiving an input from the user indicating a first group selected from the defined one or more groups; and
logging the respective one or more data sets associated with the first group.

20. A computer implemented system comprising:
a storage device comprising an executable block diagram having one or more functional modeling elements representing aspects of a system being modeled; and
a selection module configured to enable a user to query a logging property of a functional modeling element of the block diagram to enable a user to log data associated with the modeling element into the storage device during block diagram simulation without using an additional functional logging element within the block diagram, the logged data being available after completion of the block diagram simulation.

21. The system of claim 20 wherein the data is a first data set, the system further comprising:
a comparator module configured to determine when the first data set is equivalent to a second data set.

22. The system of claim 20 wherein the data is a first data set, the system further comprising:
a comparator module configured to determine when the first data set has a time vector equivalent to a second data set.

23. The system of claim 22 wherein the comparator module is further configured to store the time vector and associate the time vector with the first data set and the second data set.

24. The system of claim 22 wherein the time vector comprises a compact format.

25. The system of claim 24 wherein the compact format comprises at least three of a start time, a stop time, an interval, and number of elements.

26. The system of claim 20 further comprising:
a code generator module configured to generate code based on the block diagram, the code being configured to execute external to an execution engine and including a portion to log the data based on a user input to the selection module.

27. The system of claim 20 further comprising:
a logging module configured to collect data from an executing block diagram based on a user input to the selection module.

28. The system of claim 20 wherein the logging module is further configured to query the simulation to determine whether a functional element of the block diagram associated with the data is executing at a particular time point.

29. An article comprising a computer-readable storage medium that stores executable instructions that cause a computer to:
receive an executable block diagram having functional modeling elements representing aspects of a system being modeled; and
generate a user interface to enable a user to select data to be logged into a storage device during block diagram simulation without the use of a functional logging element within the block diagram, the logged data being available after completion of the block diagram simulation.

30. In a computing device, a method to non-intrusively log data within an executable block diagram having one or more functional modeling elements representing aspects of a system being modeled, the method comprising:
generating a first timing identifier for a first data set based on a timing characteristic of the first data set;
associating the first data set with a first task identifier established by an execution engine; and
logging data associated with the first data set into a storage device based on the first timing identifier and the first task identifier during block diagram simulation, the logged data being available after completion of the block diagram simulation.

31. The method of claim 30 wherein generating further comprises determining a checksum based on the timing characteristic.

32. The method of claim 30 further comprising:
generating a second timing identifier for a second data set based on a timing characteristic of the second data set; and
associating the second data set with a second task identifier established by an execution engine.

33. The method of claim 32 further comprising associating the first data set with the second data set if the first task identifier is equal to the second task identifier.

34. The method of claim 32 further comprising associating the second data set with the first data set if the first timing identifier is equal to the second timing identifier.

35. The method of claim 32 further comprising:
generating a data structure including the first and second timing identifiers and the first and second task identifiers; and
determining a data point for logging using the data structure.

36. The method of claim 35 wherein the data structure comprises a table.

37. The method of claim 30 further comprising generating a time vector associated with the first data set.

38. The system of claim 30 wherein the time vector composes a compact format.

39. The system of claim 38 wherein the compact format comprises at least three of a start time, a stop time, an interval, and number of elements.

40. The method of claim 30 further comprising generating an event buffer associated with the data.

41. The method of claim 40 further comprising modifying an event element in the event buffer when an associated circular data buffer overwrites existing data.

42. The method of claim 30 further comprising querying the execution engine executing the block diagram to determine whether a functional element of the block diagram associated with the first data set is executing at a particular time point.

43. A computer implemented system comprising:
a processor configured to process:
an executable block diagram having one or more functional modeling elements representing aspects of a system being modeled;
a timing identifier generator configured to generate a first timing identifier for a first data set associated with the block diagram based on a timing characteristic of the first data set; and
a logging module configured to associate the first data set with a first task identifier established by an execution engine and to log data associated with the first data based on the first timing identifier and the first task identifier during block diagram simulation, the logged data being available after completion of the block diagram simulation; and
a storage for storing the logged data.

44. The system of claim 43 wherein the first timing identifier comprises a checksum.

45. The system of claim 43, wherein the processor is further configured to process:
a comparator module configured to associate the first data set with a second data set if the first task identifier is equal to a second task identifier associated with the second data set.

46. The system of claim 43, wherein the processor is further configured to process:
a comparator module configured to generate a pointer to use with a second data set that points to the first data set if the first timing identifier is equal to a second timing identifier corresponding to the second data set and a source of the first data set is also the source of the second data set.

47. The system of claim 43 wherein the logging module is further configured to generate a time vector associated with the first data set.

48. The system of claim 43 wherein the logging module is further configured to query the execution engine executing the block diagram to determine whether a functional element of the block diagram associated with the first data set is executing at a particular time point.

49. The system of claim 43,
wherein the storage further stores a data structure including the first timing identifier and the first task identifier, and
wherein the logging module is further configured to determine if a data point is available for logging using the data structure.

50. The system of claim 49 wherein the data structure comprises a table.

51. An article comprising a computer-readable storage medium that stores executable instructions that cause a computer to:
generate a first timing identifier for a first data set based on a timing characteristic of the first data set;
associate the first data set with a first task identifier established by an execution engine; and
log data associated with the first data set into a storage device based on the first timing identifier and the first task identifier.

* * * * *